(12) United States Patent
Kim (10) Patent No.: US 7,969,507 B2
(45) Date of Patent: Jun. 28, 2011

(54) VIDEO SIGNAL RECEIVER INCLUDING DISPLAY SYNCHRONIZING SIGNAL GENERATION DEVICE AND CONTROL METHOD THEREOF

(75) Inventor: Byeong-Jin Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1207 days.

(21) Appl. No.: 11/416,180

(22) Filed: May 3, 2006

(65) Prior Publication Data

US 2007/0097263 A1 May 3, 2007

(30) Foreign Application Priority Data

Oct. 31, 2005 (KR) .................. 10-2005-0103193

(51) Int. Cl.
*H03L 7/00* (2006.01)
(52) U.S. Cl. ......... 348/537; 348/547; 348/512; 348/458
(58) Field of Classification Search .................. 348/545, 348/547, 548, 536, 537, 540, 546, 512, 516, 348/441, 445, 458
See application file for complete search history.

(56) References Cited

U.S. PATENT DOCUMENTS

| 6,316,974 B1 * | 11/2001 | Taraci et al. | 327/147 |
| 6,674,482 B1 * | 1/2004 | Park | 348/536 |

FOREIGN PATENT DOCUMENTS

| KR | 2001-69082 | 7/2001 |
| KR | 2003-33828 | 5/2003 |
| KR | 2004-64943 | 7/2004 |
| WO | WO 2005/027515 A1 | 3/2005 |
| WO | WO 2005/029845 A1 | 3/2005 |

* cited by examiner

*Primary Examiner* — M. Lee
(74) *Attorney, Agent, or Firm* — Roylance, Abrams, Berdo & Goodman, L.L.P.

(57) ABSTRACT

A video signal receiver including a display synchronizing signal generation device and control method are disclosed. The video signal receiver includes: a video processor converting an input analog video signal into a digital signal; a display processor scaling the video signal converted at the video processor with an output resolution; a displaying unit displaying the video signal scaled by the display processor; a detecting unit detecting whether an input vertical synchronization signal (In V-sync) and an output vertical synchronization signal of the analog video signal match; a PLL (Phase Locked Loop) adjusting a pixel clock according to a detection result of the detecting unit; and a timing generating unit generating an output horizontal synchronization signal and the output vertical synchronization signal by use of the pixel clock adjusted by the PLL, and providing the generated output horizontal and output vertical synchronization signals to the display processor and the detecting unit. Accordingly, it is possible to prevent twitching and freezing of a screen, even though input and output frame rates do not correspond.

15 Claims, 4 Drawing Sheets

VIDEO SIGNAL RECEIVER INCLUDING DISPLAY SYNCHRONIZING SIGNAL GENERATION DEVICE AND CONTROL METHOD THEREOF

CROSS-REFERENCE TO RELATED APPLICATION

This application claims benefit under 35 U.S.C. §119(a) of Korean Patent Application No. 2005-103193, filed on Oct. 31, 2005, in the Korean Intellectual Property Office, the entire disclosure of which is hereby incorporated by reference.

BACKGROUND OF THE INVENTION

1. Field of the Invention

The present invention relates to a video signal receiver including a display synchronizing signal generation device and control method thereof. More particularly, the present invention relates to a video signal receiver and control method thereof, which prevents twitching and freezing of a screen, even though input and output frame rates do not correspond.

2. Description of the Related Art

An analog video signal receivable at an analog video signal receiver generally includes a CVBS (Composite Video Bust Synchronization), an S-video signal, and a component signal.

The CVBS may be received through a tuner included in the analog video signal receiver or input through a VCR (Video Cassette Recorder) connection terminal.

The S-video signal may be input into the analog video signal receiver through a terminal connectable with an S-VHS (Video Home System), VCR, or a DVD (Digital Versatile Disc) capable of outputting the S-video. The S-video signal comprises a luminance signal Y and a chrominance signal C.

The component signal may be a RGB (Red, Green, and Blue) signal. Alternatively, the component signal may be in a Y/Pb/Pr or a Y/Cb/Cr form. The component signal may be input into the analog video signal receiver through a terminal connected with a device such as a computer.

The analog video signals may have a horizontal frequency and a vertical frequency changed according to peripheral environments. For example, the VCR may have such changes in the horizontal frequency and the vertical frequency in a more severe level by a recording method and a deck velocity.

However, a frequency of a display pixel clock used for the analog video signal receiver is fixed. The display pixel clock outputs the received video signal at a time suitable for a display panel.

Accordingly, the horizontal frequency and the vertical frequency of the video signal displayed at the analog video signal receiver may be variable by a set vertical mode or horizontal mode. The vertical mode may be defined as the total number of lines per frame and the horizontal mode may be defined as the total number of pixels per frame.

The analog video signal receiver has the fixed frequency of the display pixel clock and differences may be created between the input frame rate and the output frame rate when the horizontal frequency and the vertical frequency of the input video signal are varied.

According to the related art, image shortages to the display are complemented by repeating the images when an input frame rate is faster than an output frame rate which causes a screen to twitch.

In the related art, remaining images to be displayed are handled by skipping the images when the input frame is later than the output frame rate which causes the screen to freeze.

Accordingly, there is a need for an improved system and method for providing a video signal receiver to prevent screen twitching and freezing.

SUMMARY OF THE INVENTION

An aspect of exemplary embodiments of the present invention is to address at least the above problems and/or disadvantages of the related art and to provide at least the advantages described below. Accordingly, an aspect of an exemplary embodiment of the present invention is to provide a video signal receiver including a display synchronizing signal generation device and control method thereof, which prevents twitching and freezing of a screen, even though an input and output frame rates do not correspond by linking the output vertical synchronization signal with the input vertical synchronization signal.

In order to achieve the above-described aspects of the exemplary embodiments of the present invention, the video signal receiver is provided. A video processor converts an input analog video signal into a digital signal. A display processor scales the video signal converted at the video processor with an output resolution. A displaying unit displays the video signal scaled by the display processor. A detecting unit detects whether an input vertical synchronization signal (In V-sync) and an output vertical synchronization signal (Out V-sync) of the analog video signal match. A PLL (Phase Locked Loop) adjusts a pixel clock according to a detection result of the detecting unit. A timing generating unit generates an output horizontal synchronization signal and the output vertical synchronization signal by use of the pixel clock adjusted by the PLL and provides the generated output horizontal and output vertical synchronization signals to the display processor and the detecting unit.

The input vertical synchronization signal is located inside a predetermined section preset in every cycle of the output vertical synchronization signal. The detecting unit determines that the input and output vertical synchronization signals match and provides the PLL with a first control signal to maintain an existing pixel clock. When the input vertical synchronization signal is located outside the predetermined section, the detecting unit presets every cycle of the output vertical synchronization signal, determines that the input and output vertical synchronization signals do not match, and provides the PLL with one of a second control signal for increasing a frequency of the pixel clock and a third control signal for decreasing the frequency of the pixel clock.

The detecting unit comprises: a counter counting an output horizontal synchronization signal (Out H-sync) in sections between edges of the output vertical synchronization signal (Out V-sync); a latch confirming the counted value of the output horizontal synchronization signal (Out H-sync) whenever the edges of the input vertical synchronization signal (In V-sync) are detected, and counting a position of the input vertical synchronization signal (In V-sync); and a comparing unit comparing the position of the section preset in one cycle of the output vertical synchronization signal (Out V-sync) and the position of the input vertical synchronization signal (In V-sync). The comparing unit outputs the first control signal when the input vertical synchronization signal is located inside the section, outputs the second control signal when the input vertical synchronization signal is located before the section, and outputs the third signal when the input vertical synchronization signal is located after the section.

The PLL comprises a prescaler, a phase detector, a loop filter, a VCO (Voltage Controlled Oscillator), a main scaler, and a post scaler. The prescaler scales an input basic clock with a predetermined first scaling coefficient. The phase detector detects phase differences between the basic clock scaled by the prescaler and a predetermined feedback frequency. The loop filter outputs a control voltage with limited frequency substances of the phase differences detected from the phase detector. The VCO oscillates a frequency corresponding to the control voltage output by the loop filter. The main scaler generates the feedback frequency by scaling the oscillated output from the VCO with a main scaling coefficient, and provides the generated feedback frequency to the phase detector. The post scaler scales the oscillated frequency output from the VCO with a predetermined second scaling coefficient and generates the pixel clock. The main scaler maintains the main scaling coefficient when the first control signal is received from the detecting unit, increases the main scaling coefficient as according to a predetermined amount when the second control signal is received from the detecting unit, and decreases the main scaling coefficient according to the predetermined amount when the third control signal is received from the detecting unit.

The timing generating unit comprises a first divider, a horizontal synchronization signal, a second divider, and a vertical synchronization signal. The first divider generates a horizontal frequency by dividing the pixel clock into horizontal total pixels. The horizontal synchronization signal generating unit generates the output horizontal synchronization signal out of the horizontal frequency generated by the first divider. The second divider generates a vertical frequency by dividing the horizontal frequency generated by the horizontal synchronization signal generating unit into vertical total lines. The vertical synchronization signal generating unit generates the output vertical synchronization signal out of the vertical frequency provided by the second divider.

According to an exemplary embodiment of the present invention, a display synchronizing signal generation device is connected with the video signal receiver. The display synchronizing signal generation device comprises a detecting unit, a PLL (Phase Locked Loop), and a timing generating unit. The detecting unit detects whether an input vertical synchronization signal and an output vertical synchronization signal of a broadcasting signal input into the video signal receiver match. The PLL adjusts a pixel clock according to a detection result of the detecting unit. The timing generating unit generates an output horizontal synchronization signal and the output vertical synchronization signal by use of the pixel clock adjusted by the PLL, and provides the generated output horizontal and vertical synchronization signals to the video signal receiver and the detecting unit.

When the input vertical synchronization signal is located inside a predetermined section preset in every cycle of the output vertical synchronization signal, the detecting unit determines that the input and output vertical synchronization signals match and provides the PLL with a first control signal to maintain an existing pixel clock, and when the input vertical synchronization signal is located outside the predetermined section preset in every cycle of the output vertical synchronization signal, the detecting unit determines that the input and output vertical synchronization signals do not match and provides the PLL with one of a second control signal for increasing the pixel clock and a third control signal for decreasing the pixel clock.

The detecting unit comprises a counter, a latch, and a comparing unit. The counter counts the output horizontal synchronization signal (Out H-sync) in sections between edges of the output vertical synchronization signal (Out V-sync). The latch confirms the counted value of the output horizontal synchronization signal (Out H-sync) whenever the edges of the input vertical synchronization signal (In V-sync) are detected, and counts a position of the input vertical synchronization signal (In V-sync). The comparing unit compares the position of the section preset in one cycle of the output vertical synchronization signal (Out V-sync) and the position of the input vertical synchronization signal, outputs the first control signal when the input vertical synchronization signal is located inside the section, outputs the second control signal when the input vertical synchronization signal is located before the section and outputs the third signal when the input vertical synchronization signal is located after the section.

The PLL comprises a prescaler, a phase detector, a loop filter, a VCO (Voltage Controlled Oscillator), a main scaler, and a post scaler. The prescaler scales an input basic clock with a predetermined first scaling coefficient. The phase detector detects phase differences between the basic clock scaled by the prescaler and a predetermined feedback frequency. The loop filter outputs a control voltage with limited frequency substances of the phase differences detected from the phase detector. The VCO oscillates a frequency corresponding to the control voltage output by the loop filter. The main scaler generates the feedback frequency by scaling the oscillated output from the VCO with a main scaling coefficient and providing the generated feedback frequency to the phase detector. The post scaler scales the oscillated frequency output from the VCO with a predetermined second scaling coefficient and generates the pixel clock. The main scaler maintains the main scaling coefficient when the first control signal is received from the detecting unit, increases the main scaling coefficient according to a predetermined amount when the second control signal is received from the detecting unit, and decreases the main scaling coefficient according to the predetermined amount when the third control signal is received from the detecting unit.

The timing generating unit comprises a first divider, a horizontal synchronization signal generating unit, a second divider, and a vertical synchronization signal generating unit. The first divider generates a horizontal frequency by dividing the pixel clock into horizontal total pixels. The horizontal synchronization signal generating unit generates the output horizontal synchronization signal out of the horizontal frequency generated by the first divider. The second divider generates a vertical frequency by dividing the horizontal frequency generated by the horizontal synchronization signal generating unit into vertical total lines. The vertical synchronization signal generating unit generates the output vertical synchronization signal out of the vertical frequency provided by the second divider.

According to an exemplary embodiment of the present invention, a control method of a video signal receiver comprises: (a) determining whether an input vertical synchronization signal (In V-sync) and an output vertical synchronization signal match by comparing the signals; (b) adjusting a pixel clock according to the matching result; and (c) adjusting output vertical and horizontal synchronization signals by use of the adjusted pixel clock.

The operation of (a) determines that the input and output vertical synchronization signals match when the input vertical synchronization signal is located inside a predetermined section preset in every cycle of the output vertical synchronization signal, and determines that the input and output vertical synchronization signals do not match when the input vertical synchronization signal is located outside the predetermined section preset in every cycle of the output vertical synchronization signal.

The operation of (b) maintains an existing pixel clock when determining that the input and output vertical synchronization signals match, and adjusts a frequency of the pixel clock when determining that that the input and output vertical synchronization signals do not match.

The operation of (b) increases the frequency of the pixel clock when determining that the input vertical synchronization signal is located before the section, and that the input and output vertical synchronization signals do not match. The operation of (b) decreases the frequency of the pixel clock when determining that the input vertical synchronization signal is located after the section, and that the input and output vertical synchronization signals do not match.

Other objects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above aspect and other exemplary objects, features and advantages of certain exemplary embodiments of the present invention will be more apparent from the following description taken in conjunction with the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
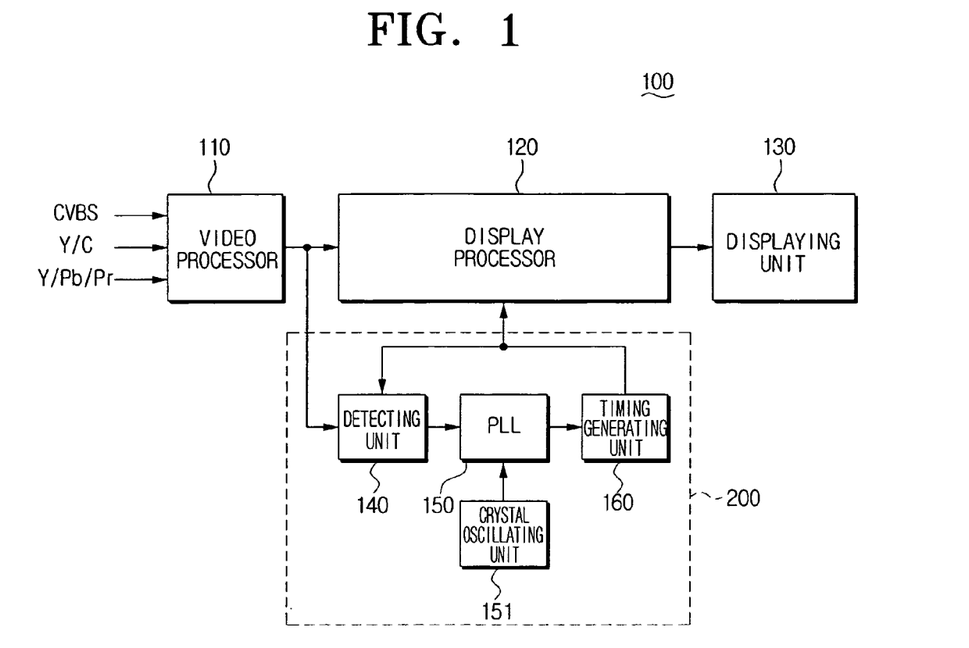
FIG. 1 is a block diagram of a video signal receiver according to an exemplary embodiment of the present invention.

FIG. 1 is a block diagram of a video signal receiver according to an exemplary embodiment of the present invention.

As illustrated in FIG. 1, the video signal receiver 100 includes a video processor 110, a display processor 120, a displaying unit 130 and a display synchronizing signal generation device 200.

The display synchronizing signal generation device 200 includes a detecting unit 140, a PLL (Phase Locked Loop) 150, a crystal oscillating unit 151 and a timing generating unit 160.

The video processor 110 converts an input analog video signal into a digital signal. The analog video signal is separated into a luminance signal Y and a chrominance signal C. The luminance signal Y and the chrominance signal C are formatted in one form of ITU-R 656 or ITU-601, respectively.

When a CVBS (Composite Video Bust Synchronization) of the analog video signals is input, the video processor 110 separates the received analog signal into Y/C/Sync, separates the C signal into UN, and formats the UN in one form of ITU-R 656 or ITU-601 and outputs as a digital video signal.

When an S-video signal is input, the video processor 110 separates a synchronization signal (Sync) from the Y signal, separates the C signal into UN, formats the UN in one form of ITU-R 656 or ITU-601 and outputs as a digital video signal.

When a component signal is input, the video processor 110 separates a synchronization signal (Sync) from the Y signal, separates the C signal into UN again, formats the UN in one form of ITU-R 656 or ITU-601 and outputs as a digital video signal.

The input video signal may have its horizontal and vertical frequencies changed by peripheral environments.

The display processor 120 receives the video signal output from the video processor. When the output video signal is an interlace signal, the display processor 120 deinterlaces the signal, scales the deinterlaced signal up or down with a resolution fit for a display panel (for example, an output resolution) and outputs the signal scaled up or down as a digital RGB.

A display pixel clock is required to output the signal at a time suitable for the displaying unit 130. The display pixel clock is generated by the following formula 1.

$$\text{Pixel Clock} = (H\text{-total Pixel}) \times (V\text{-total line}) \times (\text{vertical frequency}) \quad \text{[Formula 1]}$$

H-total Pixel is the number of total horizontal pixels and V-total line is the number of the vertical lines.

The displaying unit 130 may be a device such as an LCD (Liquid Crystal Display) or a PDP (Plasma Display Panel), and displays the digital RGB output from the display processor 120.

The detecting unit 140 determines the location of an input vertical synchronization signal and outputs a corresponding control signal. For example, the detecting unit 140 determines which section of an output vertical synchronization signal an input vertical synchronization signal output from the video processor 110 is located in, and outputs a corresponding control signal. That is, the detecting unit 140 detects whether the input vertical synchronization signal (In V-sync) and the output vertical synchronization signal (Out V-sync) match.

The PLL (Phase Locked Loop) 150 adjusts a basic pixel clock output from the crystal oscillating unit 151 according to the control signal output from the detecting unit 140.

The timing generating unit 160 generates horizontal and vertical synchronization signals with the pixel clock output from the PLL 150. The timing generating unit 160 outputs the generated horizontal vertical synchronization signals to the display processor 120 and to the detecting unit 140.

Figure 2:
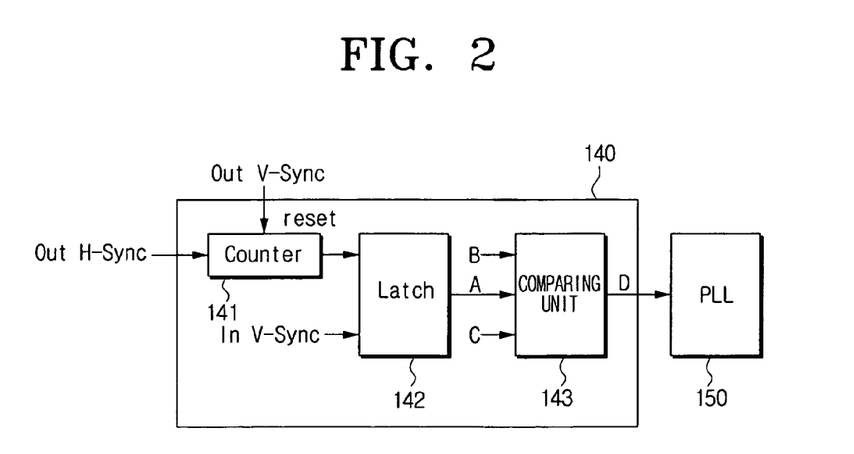
FIG. 2 shows a detecting unit of FIG. 1.

FIG. 2 shows the detecting unit 140 of FIG. 1.

Figure 3:
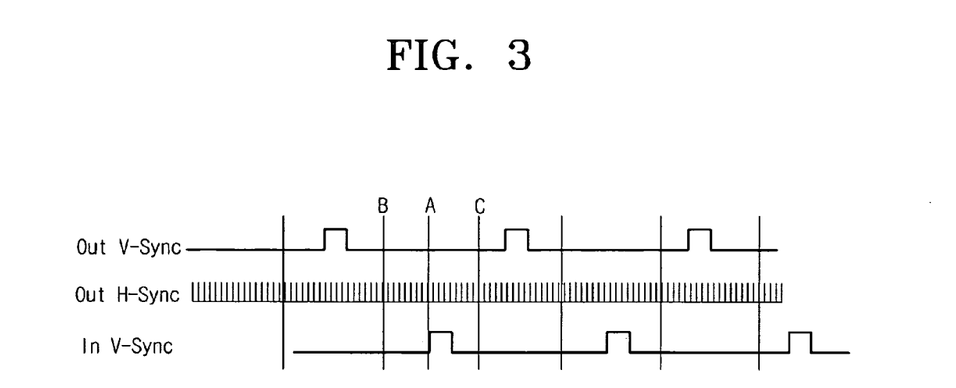
FIG. 3 is a timing diagram of synchronization signals input into the detecting unit of FIG. 1.

FIG. 3 is a timing diagram of synchronization signals input into the detecting unit 140 of FIG. 1.

As illustrated in FIG. 2, the detecting unit 140 includes a counter 141, a latch 142, and a comparing unit 143.

As illustrated in FIG. 3, the output vertical synchronization signal (Out V-sync), the output horizontal synchronization signal (Out H-sync), and the input vertical synchronization signal (In V-sync) are input into the detecting unit 140 in a predetermined time interval.

The counter 141 is reset whenever an edge of the output vertical synchronization signal (Out V-sync) is detected. The counter 141 counts the output horizontal synchronization signal (Out H-sync) from the point at which an edge of the Out V-sync is detected.

The latch 142 counts a location information A of the input vertical synchronization signal (In V-sync) from the counted value of the output horizontal synchronization signal (Out H-sync) whenever the edge of the input vertical synchronization signal (In V-sync) is detected.

The user sets a predetermined first location information B and a second location information C bigger than the first location information B in one cycle of the output vertical synchronization signal (Out V-sync). That is, the user sets a predetermined first location information B and a second location information C in an output 1 frame and inputs into the comparing unit 143. The first location information B and the second location information C may be properly decided by the displaying unit 130.

When the location information A of the input vertical synchronization signal (In V-sync) is located between the first location information B and the second location information C, the comparing unit 143 transmits a first control signal D maintaining an existing control signal to the PLL 150.

When the location information A of the input vertical synchronization signal (In V-sync) is smaller than the first location information B, the comparing unit 143 transmits a second control signal D to the PLL 150 to have a scaling coefficient +1.

When the location information A of the input vertical synchronization signal (In V-sync) is bigger than the second location information C, the comparing unit 143 transmits a third control signal D to the PLL 150 to have a scaling coefficient −1.

Figure 4:
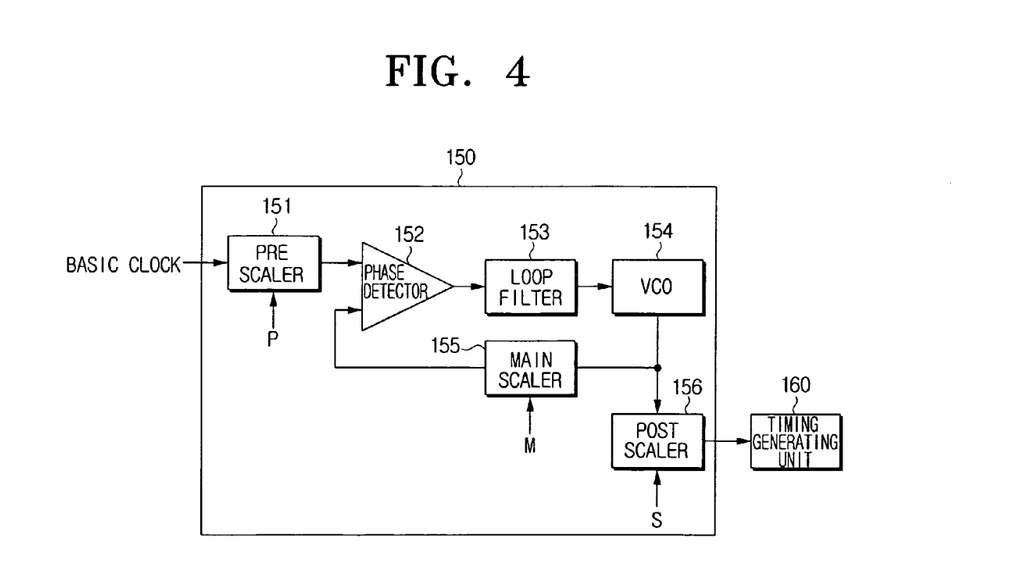
FIG. 4 shows a PLL (Phase Locked Loop) of FIG. 1.

FIG. 4 shows the PLL 150 of FIG. 1.

As illustrated in FIG. 4, the PLL 150 includes a prescaler 151, a phase detector 152, a loop filter 153, a VCO (Voltage Controlled Oscillator) 154, a main scaler 155, and a post scaler 156.

The prescaler 151 scales a predetermined basic clock output from the crystal oscillating unit 151 with a predetermined first scaling coefficient P.

The phase detector 152 detects phase differences between the scaled basic clock output from the prescaler 151 and a predetermined feedback frequency. The feedback frequency is scaled by the main scaler 155.

The loop filter 153 outputs a control voltage having limited frequency substances of the phase differences output from the phase detector 152. The VOC 154 oscillates a frequency corresponding to the control voltage output from the loop filter 153.

The main scaler 155 scales the oscillation frequency output from the VCO 154 with a main scaling coefficient M and provides a predetermined feedback frequency to the phase detector 152.

When the location information A of the input vertical synchronization signal (In V-sync) is located between the first location information B and the second location information C, the comparing unit 143 transmits the first control signal D to the main scaler 155 to maintain the main scaling coefficient M.

When the location information A of the input vertical synchronization signal (In V-sync) is smaller than the first location information B, the comparing unit 143 transmits the second control signal D to the main scaler 155 to maintain the main scaling coefficient M+1. That is, when an output frame rate is late, the main scaling coefficient M increases and the feedback frequency slows down. Accordingly, a pixel clock output from the VCO 154 quickens, which leads to the faster output frame rate.

When the location information A of the input vertical synchronization signal (In V-sync) is bigger than the second location information C, the comparing unit 143 transmits the third control signal D to the main scaler 155 to have the main scaling coefficient M−1. That is, when the output frame rate is faster, the main scaling coefficient M decreases and the feedback frequency quickens. Accordingly, the pixel clock output from the VCO 154 slows down, which leads to the slower output frame rate.

The post scaler 156 scales the oscillation frequency output from the VCO 154 with a second scaling coefficient S. The scaled frequency is transmitted to the timing generating unit 160 as the pixel clock.

Figure 5:
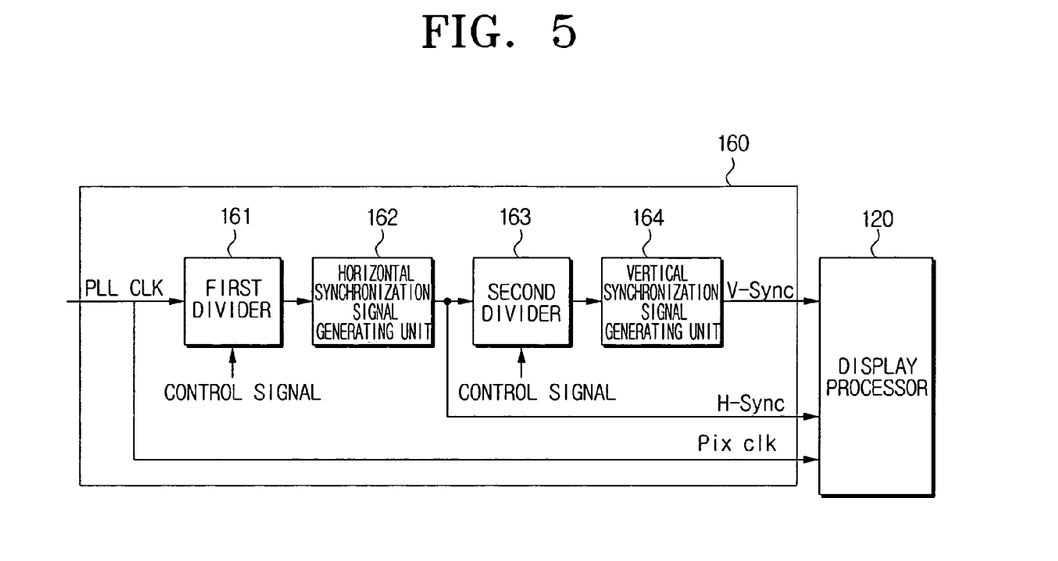
FIG. 5 shows a timing generating unit of FIG. 1.

FIG. 5 shows the timing generating unit 160 of FIG. 1.

As illustrated in FIG. 5, the timing generating unit 160 includes a first divider 161, a horizontal synchronization signal generating unit 162, a second divider 163 and a vertical synchronization signal generating unit 164.

The timing generating unit 160 generates H, V Sync, and DE (data enable) signals based on information such as H-total pixel, V-total line, H, V Sync width, H front/back porch, V front/back porch, H active start/end, and V active start/end.

A horizontal frequency is generated by the following formula 2.

Horizontal Frequency=Pixel Clock/$H$-total pixel    [Formula 2]

A vertical frequency is generated by the following formula 3.

Vertical Frequency=Horizontal Frequency/$V$-total line    [Formula 3]

The first divider 161 generates the horizontal frequency by dividing the pixel clock (Pix Clk) into the horizontal total pixel (H-total pixel). The horizontal synchronization signal generating unit 162 generates the horizontal synchronization signal (H-sync) out of the horizontal frequency provided from the first divider 161.

The second divider 163 generates the vertical frequency by dividing the horizontal frequency provided from the horizontal synchronization signal generating unit 162 into the vertical total line (V-total line). The vertical synchronization signal generating unit 164 generates the vertical synchronization signal (V-sync) out of the vertical frequency provided from the second divider 163.

Accordingly, the timing generating unit 160 provides the displaying processor 120 with the pixel clock (Pix Clk), the horizontal synchronization signal (H-sync), and the vertical synchronization signal (V-sync). The timing generating unit 160 also provides the detecting unit 140 with the horizontal synchronization signal (H-sync) and the vertical synchronization signal (V-sync).

Figure 6:
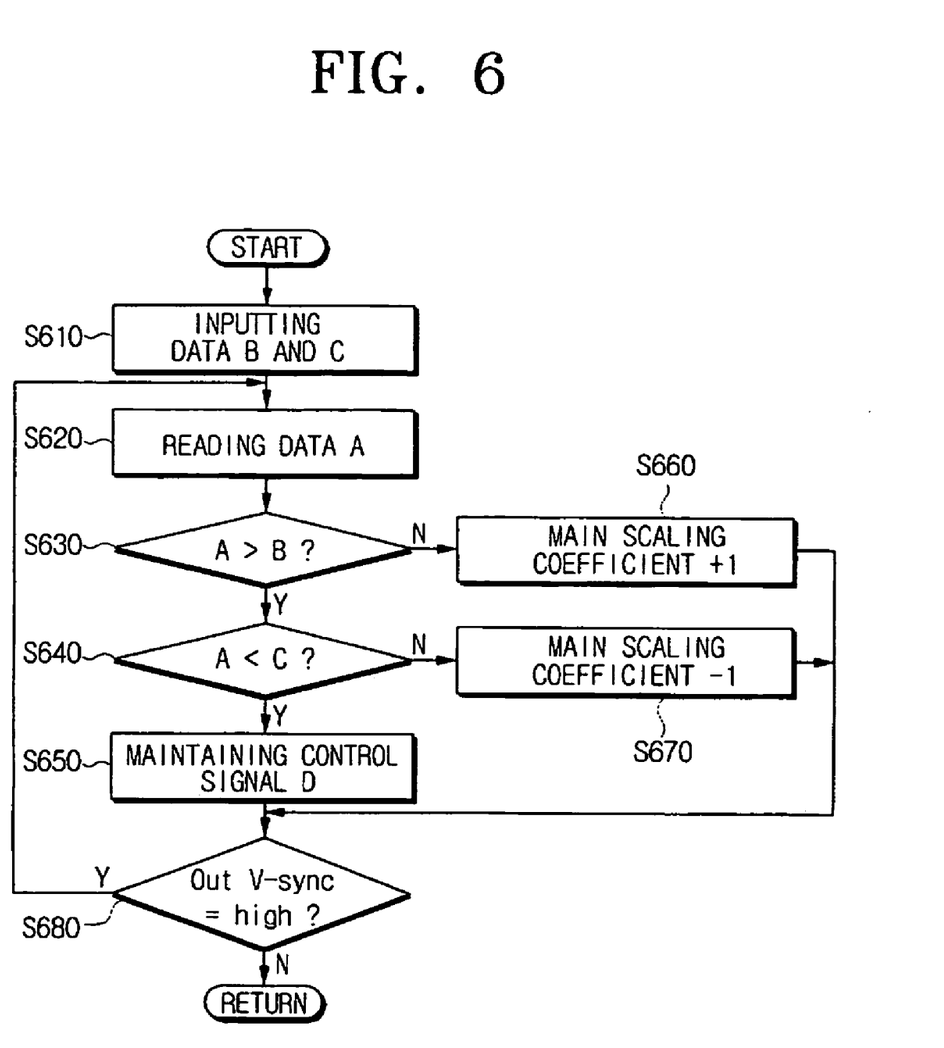
FIG. 6 is a flowchart of a control method of a video signal receiver according to the exemplary embodiment of the present invention.

FIG. 6 is a flowchart of a control method of a video signal receiver according to an exemplary embodiment of the present invention.

As illustrated in FIG. 6, in one cycle of an output vertical synchronization signal (Out V-sync), (for example, in an output 1 frame) a predetermined first location information B and a predetermined second location information C bigger than the first location information B are set, and input into a video signal receiver 100 (S610).

Accordingly, sections between the first location information B and the second information C are set at every cycle of the output vertical synchronization signals. The first location information B and second location information C may be input as a value arbitrarily set by a user or as a value set during a manufacturing step and fixed.

The video signal receiver 100 reads location information A of an input vertical synchronization signal (In V-sync) (S620).

The decision to maintain a control signal D to be transmitted to a PLL (Phase Locked Loop) 150 is made by comparing the first location information B, the second location information C, and a location information A of the input vertical synchronization signal (In V-sync) (S630, S640), (S650, S660, S670).

An existing first control signal D is maintained when the location information A of the input vertical synchronization signal (In V-sync) is bigger than the first location information B and smaller than the second location information C (S650). When the input vertical synchronization signal is located in a preset section of the output vertical synchronization signal, it is determined that the input and output vertical synchronization signals match, and the existing status is maintained.

When the location information A of the input vertical synchronization signal (In V-sync) is smaller than the first location information B, a second control signal D is transmitted to have a main scaling coefficient +1 (S660). That is, when the input vertical synchronization signal is located before the preset section of the output vertical synchronization signal, it is determined that the input and output vertical synchronization signals do not match and the pixel clock increases.

When the location information A of the input vertical synchronization signal (In V-sync) is smaller than the first location information C, a third control signal D is transmitted to have the main scaling coefficient −1 (S670). When the input vertical synchronization signal is located after the preset section of the output vertical synchronization signal, it is determined that the input and output vertical synchronization signals do not match and the pixel clock decreases.

When the output vertical synchronization signal (Out V-sync) is "high", the operation of S670 is repeated at the operation of S620 (S680). Accordingly, it is possible to adjust a frequency of the pixel clock when the output vertical synchronization signal (Out V-sync) is input. Therefore, the input and output vertical synchronization signals match, and twitching and freezing of the screen is prevented.

As mentioned above, all the unmatched cases between the input and output frame rates can be stably locked, by linking the output vertical synchronization signal with the input vertical synchronization signal. All the unmatched cases may include changes in horizontal and vertical frequencies of an input video signal, clock changes due to crystal oscillation errors, clock changes with the phase synchronization loop temperature and time passing, and frame rates 59.94 Hz and 60 Hz input while changed. That is, the twitching and freezing of screens is prevented.

While the present invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A video signal receiver comprising:
   a video processor for converting an input analog video signal into a digital signal;
   a display processor for scaling the video signal converted at the video processor with an output resolution;
   a displaying unit for displaying the video signal scaled by the display processor;
   a detecting unit for detecting whether an input vertical synchronization signal (In V-sync) and an output vertical synchronization signal (Out V-sync) of the analog video signal match;
   a PLL (Phase Locked Loop) for adjusting a pixel clock according to a detection result of the detecting unit;
   wherein the detection result adjusts the pixel clock according to a control signal by affecting a scaling coefficient in the PLL; and
   a timing generating unit for generating an output horizontal synchronization signal and the output vertical synchronization signal by use of the pixel clock adjusted by the PLL, and providing the generated output horizontal and output vertical synchronization signals to the display processor and the detecting unit.

2. The video signal receiver of claim 1, wherein the detecting unit determines that the input and output vertical synchronization signals match and provides the PLL with a first control signal to maintain an existing pixel clock when the input vertical synchronization signal is located inside a section preset in every cycle of the output vertical synchronization signal, and the detecting unit determines that the input and output vertical synchronization signals do not match and provides the PLL with one of a second control signal for increasing a frequency of the pixel clock and a third control signal for decreasing the frequency of the pixel clock when the input vertical synchronization signal is located outside the section preset in every cycle of the output vertical synchronization signal.

3. The video signal receiver of claim 2, wherein the detecting unit comprises:
   a counter for counting an output horizontal synchronization signal (Out H-sync) in sections between edges of the output vertical synchronization signal (Out V-sync);
   a latch for confirming the counted value of the output horizontal synchronization signal (Out H-sync) whenever the edges of the input vertical synchronization signal (In V-sync) are detected, and counting a position of the input vertical synchronization signal (In V-sync); and
   a comparing unit for comparing the position of the section preset in one cycle of the output vertical synchronization signal (Out V-sync) and the position of the input vertical synchronization signal (In V-sync), outputting the first control signal when the input vertical synchronization signal is located inside the section, outputting the second control signal when the input vertical synchronization signal is located before the section and outputting the third signal when the input vertical synchronization signal is located after the section.

4. The video signal receiver of claim 3, wherein the PLL comprises:
   a prescaler for scaling an input basic clock with a first scaling coefficient;
   a phase detector for detecting phase differences between the basic clock scaled by the prescaler and a feedback frequency;
   a loop filter for outputting a control voltage with limited frequency substances of the phase differences detected from the phase detector;
   a VCO (Voltage Controlled Oscillator) for oscillating a frequency corresponding to the control voltage output by the loop filter;
   a main scaler for generating the feedback frequency by scaling the oscillated output from the VCO with a main scaling coefficient, and providing the generated feedback frequency to the phase detector; and
   a post scaler for scaling the oscillated frequency output from the VCO with a second scaling coefficient and generating the pixel clock,
   wherein the main scaler maintains the main scaling coefficient when the first control signal is received from the detecting unit, increases the main scaling coefficient according to an amount when the second control signal is received from the detecting unit, and decreases the main scaling coefficient according to the amount when the third control signal is received from the detecting unit.

5. The video signal receiver of claim 1, wherein the timing generating unit comprises:
a first divider for generating a horizontal frequency by dividing the pixel clock into horizontal total pixels;
a horizontal synchronization signal generating unit for generating the output horizontal synchronization signal out of the horizontal frequency generated by the first divider;
a second divider for generating a vertical frequency by dividing the horizontal frequency generated by the horizontal synchronization signal generating unit into vertical total lines; and
a vertical synchronization signal generating unit for generating the output vertical synchronization signal out of the vertical frequency provided by the second divider.

6. A display synchronizing signal generation device connected with the video signal receiver, a display synchronizing signal generation device comprising:
a detecting unit for detecting whether an input vertical synchronization signal and an output vertical synchronization signal of a broadcasting signal input into the video signal receiver match;
a PLL (Phase Locked Loop) for adjusting a pixel clock according to a detection result of the detecting unit; wherein the detection result adjusts the pixel clock according to a control signal by affecting a scaling coefficient in the PLL; and
a timing generating unit for generating an output horizontal synchronization signal and the output vertical synchronization signal by use of the pixel clock adjusted by the PLL, and providing the generated output horizontal and vertical synchronization signals to the video signal receiver and the detecting unit.

7. The display synchronizing signal generation device of claim 6, wherein the detecting unit determines that the input and output vertical synchronization signals match and provides the PLL with a first control signal to maintain an existing pixel clock when the input vertical synchronization signal is located inside a section preset in every cycle of the output vertical synchronization signal, and the detecting unit determines that the input and output vertical synchronization signals do not match and provides the PLL with one of a second control signal for increasing the pixel clock and a third control signal for decreasing the pixel clock when the input vertical synchronization signal is located outside the section preset in every cycle of the output vertical synchronization signal.

8. The display synchronizing signal generation device of claim 7, wherein the detecting unit comprises:
a counter for counting the output horizontal synchronization signal (Out H-sync) in sections between edges of the output vertical synchronization signal (Out V-sync);
a latch for confirming the counted value of the output horizontal synchronization signal (Out H-sync) whenever the edges of the input vertical synchronization signal (In V-sync) are detected, and counting a position of the input vertical synchronization signal (In V-sync); and
a comparing unit for comparing the position of the section preset in one cycle of the output vertical synchronization signal (Out V-sync) and the position of the input vertical synchronization signal (In V-sync), outputting the first control signal when the input vertical synchronization signal is located inside the section, outputting the second control signal when the input vertical synchronization signal is located before the section and outputting the third signal when the input vertical synchronization signal is located after the section.

9. The display synchronizing signal generation device of claim 8, wherein the PLL comprises:
a prescaler for scaling an input basic clock with a first scaling coefficient;
a phase detector for detecting phase differences between the basic clock scaled by the prescaler and a feedback frequency;
a loop filter for outputting a control voltage with limited frequency substances of the phase differences detected from the phase detector;
a VCO (Voltage Controlled Oscillator) for oscillating a frequency corresponding to the control voltage output by the loop filter;
a main scaler for generating the feedback frequency by scaling the oscillated output from the VCO with a main scaling coefficient, and providing the generated feedback frequency to the phase detector; and
a post scaler for scaling the oscillated frequency output from the VCO with a second scaling coefficient and generating the pixel clock,
wherein the main scaler maintains the main scaling coefficient when the first control signal is received from the detecting unit, increases the main scaling coefficient according to an amount when the second control signal is received from the detecting unit, and decreases the main scaling coefficient according to the amount when the third control signal is received from the detecting unit.

10. The display synchronizing signal generation device of claim 6, wherein the timing generating unit comprises:
a first divider for generating a horizontal frequency by dividing the pixel clock into horizontal total pixels;
a horizontal synchronization signal generating unit for generating the output horizontal synchronization signal out of the horizontal frequency generated by the first divider;
a second divider for generating a vertical frequency by dividing the horizontal frequency generated by the horizontal synchronization signal generating unit into vertical total lines; and
a vertical synchronization signal generating unit for generating the output vertical synchronization signal out of the vertical frequency provided by the second divider.

11. A control method for a video signal receiver, comprising the steps of:
determining whether an input vertical synchronization signal (In V-sync) and an output vertical synchronization signal (Out V-sync) match by comparing In V-sync and Out V-sync signals;
adjusting a pixel clock according to the matching result by affecting a scaling coefficient for maintaining, increasing or decreasing the frequency of the pixel clock; and
adjusting an output vertical and horizontal synchronization signals by use of the adjusted pixel clock,
wherein the determining step determines that the input and output vertical synchronization signals match when the input vertical synchronization signal is located inside a section preset in every cycle of the output vertical synchronization signal, and determines that the input and output vertical synchronization signals do not match when the input vertical synchronization signal is located outside the section preset in every cycle of the output vertical synchronization signal.

12. A control method for a video signal receiver as claimed in claim 11, wherein the pixel clock adjusting step maintains an existing pixel clock when determining that the input and output vertical synchronization signals match, and adjusts a frequency of the pixel clock when determining that that the input and output vertical synchronization signals do not match.

13. A control method for a video signal receiver as claimed in claim 12, wherein the pixel clock adjusting step increases the frequency of the pixel clock when determining that the input vertical synchronization signal is located before the section, and the input and output vertical synchronization signals do not match, and decreases the frequency of the pixel clock when determining that the input vertical synchronization signal is located after the section, and the input and output vertical synchronization signals do not match.

14. The video signal receiver of claim 1, wherein the detecting unit determines that the input and output vertical synchronization signals match when the input vertical synchronization signal is located inside a section preset in every cycle of the output vertical synchronization signal, and the detecting unit determines that the input and output vertical synchronization signals do not match when the input vertical synchronization signal is located outside the section preset in every cycle of the output vertical synchronization signal.

15. The display synchronizing signal generation device of claim 6, wherein the detecting unit determines that the input and output vertical synchronization signals match when the input vertical synchronization signal is located inside a section preset in every cycle of the output vertical synchronization signal, and the detecting unit determines that the input and output vertical synchronization signals do not match when the input vertical synchronization signal is located outside the section preset in every cycle of the output vertical synchronization signal.

* * * * *